United States Patent
Lindenberg

(10) Patent No.: US 8,431,493 B2
(45) Date of Patent: Apr. 30, 2013

(54) REPLACEABLE SUBSTRATE MASKING ON CARRIER AND METHOD FOR PROCESSING A SUBSTRATE

(75) Inventor: Ralph Lindenberg, Büdingen-Rinderbügen (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/890,194

(22) Filed: Sep. 24, 2010

(65) Prior Publication Data
US 2012/0070999 A1 Mar. 22, 2012

(30) Foreign Application Priority Data
Sep. 17, 2010 (EP) .................... 10177419

(51) Int. Cl.
*H01L 21/31* (2006.01)
(52) U.S. Cl.
USPC .................. 438/758; 118/500; 118/720
(58) Field of Classification Search .............. 118/500, 118/503, 504, 720, 721; 438/758
See application file for complete search history.

(56) References Cited

U.S. PATENT DOCUMENTS
5,228,501 A 7/1993 Tepman et al.
2009/0165710 A1 7/2009 Kee et al.

FOREIGN PATENT DOCUMENTS
JP 61276969 A 12/1986
WO WO-2010023109 A1 3/2010

OTHER PUBLICATIONS

English Translation of JP-61276969.*
European Search Report for corresponding EP application No. EP 10 17 7419, dated May 20, 2011.

* cited by examiner

*Primary Examiner* — Julia Slutsker
(74) *Attorney, Agent, or Firm* — Patterson & Sheridan, LLP

(57) ABSTRACT

A holding device adapted for holding a mask and a substrate during processing is described. The holding device includes a substrate carrier adapted for carrying the substrate; and a mask for masking the substrate, wherein the mask is releasably connected to the substrate carrier; wherein the substrate carrier or the mask has at least one recess adapted for receiving a cover for covering the substrate carrier during deposition.

11 Claims, 4 Drawing Sheets

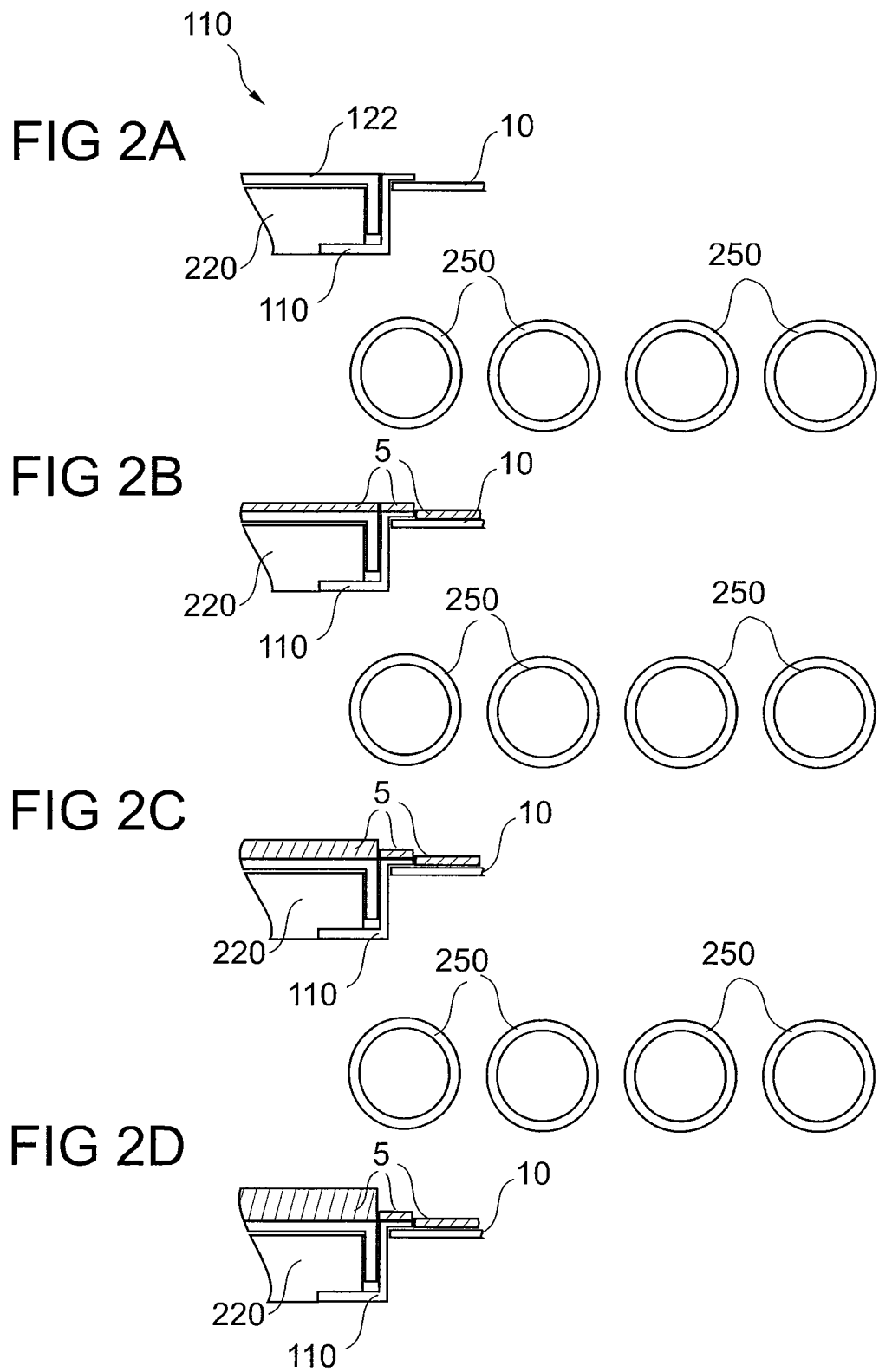

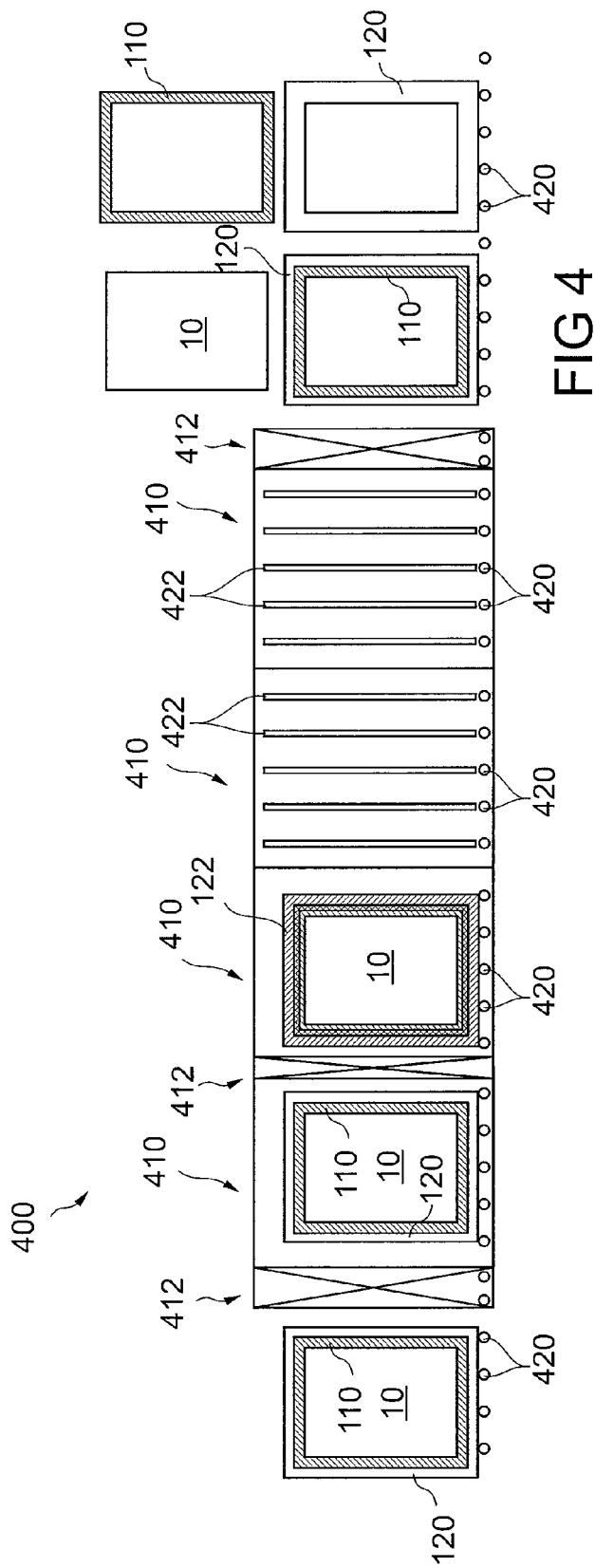
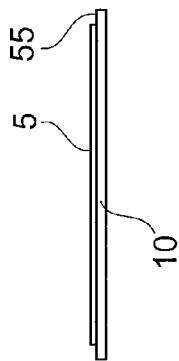
FIG 4
FIG 5

REPLACEABLE SUBSTRATE MASKING ON CARRIER AND METHOD FOR PROCESSING A SUBSTRATE

TECHNICAL FIELD OF THE INVENTION

Embodiments of the present invention relate to a holding device, and in particular to a holding device for holding a mask and a substrate during processing of the substrate. The holding device may be used for producing displays and alternative energy products such as solar cells, light-emitting diodes or organic light-emitting diodes. Furthermore, the present invention relates to a substrate processing system and a method of processing a substrate.

BACKGROUND OF THE INVENTION

A variety of microelectronic, microtechnique, microoptic or combined devices are based on substrates which are processed in an appropriate manner. For example, substrates may be processed for forming layers of a display, photovoltaic layers, light emitting layers, or for modifying surfaces etc. In many cases, substrates are coated by thin films which can be structured during a deposition process. Thereby, typically a portion of a substrate such as an area along the circumference of a substrate or other portions of the substrates are shielded to avoid deposition of these portions. Such kinds of shielding or patterning are based on a mask arranged at a surface of a substrate to be processed. Shielding of portions of a substrate commonly results in deposition of material on a mask, which can in turn shadow the area on the substrate to be processed. Such deposition of material on a mask can reduce the uptime of a processing system.

Further, masking a substrate may be performed by using a mask foil attached to a mask frame. As integrated circuits and other structures are rapidly shrinking in feature size, micro-patterning techniques may be applied to achieve a desired minimum line width of the pattern. Patterns may be formed closely adjacent to each other on a substrate to be processed. An increasing level of complexity of device and integration of devices formed by micro-technological methods may be achieved by a processing technology based on a fine pattern of a mask device. This pattern is typically formed with a high accuracy which increases the cost of the mask device. During patterning of the substrate to be processed, the mask is arranged between a deposition source providing the deposition material and the substrate. The mask foil may include a desired pattern which is transferred, during a deposition process, onto the substrate surface. When the deposition source emits deposition material towards the surface of the substrate, the pattern of the mask foil at least partially shields the surface of the substrate to be processed from deposition material. Thus, a desired pattern may be obtained at the surface of the substrate. The same applies if a margin of the substrate is masked.

In order to obtain an efficient coverage of the substrate surface to be processed by deposition material, shadowing effects of the mask frame holding the mask foil should be avoided. Accordingly, it is desirable to reduce or control shadowing effects in order to increase uptime. In particular the shadowing effect should be reduced or controlled in such a manner that a cleaning of masks and covers should correspond to other maintenance cycles of the processing system.

SUMMARY OF THE INVENTION

In light of the above, a holding device adapted for holding a mask and a substrate during processing according to independent claim 1 is provided. Furthermore, a substrate processing system according to claim 8 and a method for processing a substrate according to independent claim 11 are provided.

According to one embodiment, a holding device adapted for holding a mask and a substrate during processing is provided, the holding device including a substrate carrier adapted for carrying the substrate; and a mask for masking the substrate, wherein the mask is releasably connected to the substrate carrier; wherein the substrate carrier or the mask has at least one recess adapted for receiving a cover for covering the substrate carrier during deposition.

According to a further embodiment, a substrate processing system is provided. The processing system includes a processing chamber; a carrier cover provided in the processing chamber; and a holding device. The holding device includes a substrate carrier adapted for carrying the substrate; and a mask for masking the substrate, wherein the mask is releasably connected to the substrate carrier; wherein the substrate carrier or the mask has at least one recess adapted for receiving a cover for covering the substrate carrier during deposition.

According to a yet further embodiments, a method for processing a substrate is provided. The method includes providing a holding device having a substrate carrier and a mask; attaching the substrate to be processed to the holding device; transferring the carrier together with the substrate and the mask into a processing chamber; covering the carrier within the processing chamber; processing the substrate; and transferring the carrier, the substrate and the mask out of the processing chamber.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIGS. 2A to 2D illustrates material build up on a mask and a carrier cover for holding devices and methods of processing substrates according to embodiments described herein.

FIG. 4 shows a schematic view of a processing system with a holding device according to embodiments described herein; and FIG. 5 illustrates a substrate that has been processed with a mask.

DETAILED DESCRIPTION OF THE EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Embodiments described herein refer inter alia to a holding device adapted for holding a mask and a substrate during processing of the substrate, e.g. while depositing material on the substrate surface. The substrate may be provided with a layer or with desired pattern using a deposition source providing deposition material, the deposition material being directed towards the substrate and the mask device.

In particular, the holding device includes a substrate carrier adapted for carrying the substrate; and a mask for masking the substrate, wherein the mask is releasably connected to the substrate carrier; wherein the substrate carrier or the mask has at least one recess adapted for receiving a cover for covering the substrate carrier during deposition.

Shadow mask frames arranged on the substrate carrier may point in the direction where the deposition source is located. Such kind of shadow mask frames may cause shadowing effects during a deposition process, the shadowing effects resulting in a reduction of useable substrate area. In light of the releasable connection of the mask, the mask can be exchanged more regularly and the carrier cover inserted in the recess avoids deposition of the inserted portions and further loss of useable substrate area.

Figure 1A:
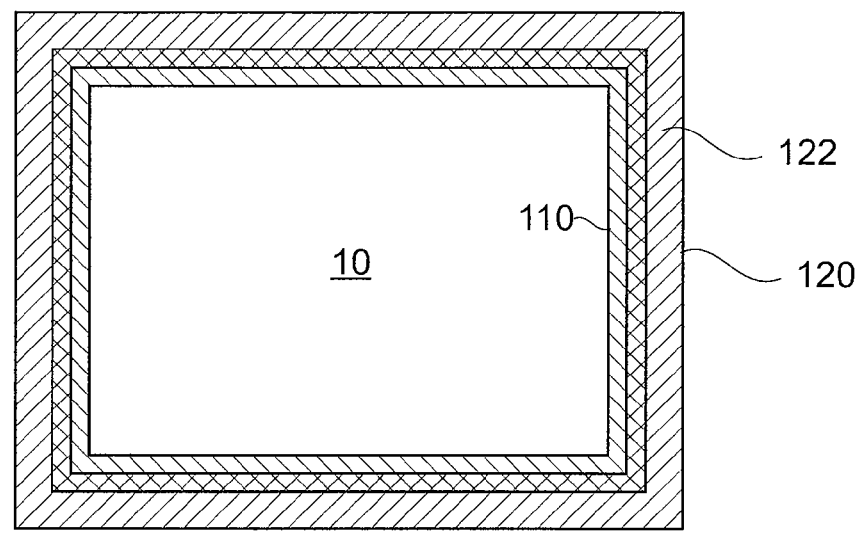
FIG. 1A shows a schematic top view of a holding device according to typical embodiments.
Figure 1B:
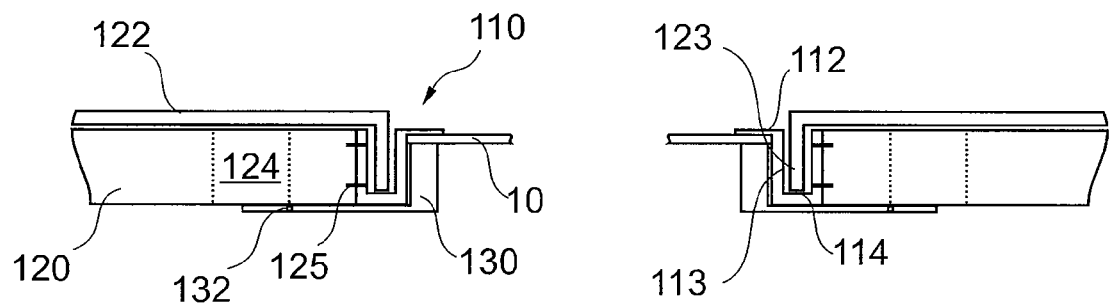
FIG. 1B shows a schematic side view of a holding device according to embodiments described herein, and illustrates the holding device e.g. shown in FIG. 1 in a condition when substrate processing may be carried out.

FIGS. 1A and 1B illustrate a holding device 100 according to embodiments described herein. The holding device 100 includes a substrate carrier 120 and a mask 110. The mask 110 shields the outer edge of the substrate 10. Typically, the outer edge is shielded along the circumference of the substrate 10. The mask 110 and the carrier 120 are releasably connected as indicated by screws 125. According to other embodiments, other fixation means for releasably connecting the mask 110 and the carrier 120 can be applied. This can for example be a clamping mechanism, a latch or other releasable fixation means. As shown in FIG. 1B, the mask 110 has a recess 113. A protrusion of the cover 122 for covering the substrate carrier 120 can be inserted in the recess 113.

According to typical embodiments, which can be combined with other embodiments described herein, the recess can have a cross-sectional shape which is rectangular, as shown in FIG. 1B, or which might have a square shape, a concave shape, a triangular shape or combinations thereof.

For example, a meander-type cross-sectional shape can be realized in order to avoid any deposition of material on the protrusion 123 of the substrate carrier cover 122.

In light of the above, the substrate 10 is covered by the mask 110 and the carrier 120 is in turn covered by the carrier cover 122. As shown in FIGS. 1A and 1B, the recess 113 is included in the mask 110. According to other embodiments, the recess might also be included in the substrate carrier 120 or can be provided between the carrier and the mask, i.e. can be provided by the carrier and the mask.

As shown in FIG. 1B, yet further embodiments, which can be combined with other embodiments described herein, can include a clamping mechanism for the substrate 10. The clamping mechanism can, for example, be an interlock 113 which can be rotated with respect to axis 132. The substrate carrier 120 shown in FIG. 1B has, for example, a space 124 such that the arm of the interlock 113 can rotate freely around the axis 132. According to yet further embodiments, which can be combined with other embodiments described herein, a clamping mechanism for the substrate 10 can also include a linear bearing, which is movable enabling to clamp the substrate 10 or release the substrate after processing, respectively.

As described above, the holding device having a carrier and a mask for holding a substrate during processing of the substrate includes, for covering, a mask for the substrate and a carrier cover. Thereby, the substrate itself is covered by the mask and the carrier is covered by the carrier cover. Optionally, also an outer portion of the mask can be covered by the carrier cover. Accordingly, the carrier cover provides a second cover, which is typically outside of the mask. Due to the connection of the mask and the carrier, the mask can be transferred together with the carrier, wherein the substrate is provided in the holding device, through the processing system. Thereby, the mask can be exchanged on a regular basis outside of the processing system. Further, the carrier cover can be maintained in the processing system. Since the carrier cover is an outer cover, which does not directly shield the substrate itself, material built up due to deposition in the processing system is less critical for the carrier cover. Accordingly, covering of the substrate and the carrier is conducted with a two-component assembly.

Contrary to systems where the mask for shielding the substrate itself is kept in a processing system, integration of the masking shield or masking shields into the carrier allows a replacement of the masking shield or masking shields outside the processing system, for example a vacuum coating system. Thereby, on replacement of the carrier also a replacement of the mask can be conducted and the shadowing effect of the mask, which influences the deposition on the substrate can be reduced. Thereby, the uptime of the system can be increased, for example to a maintenance frequency which corresponds to the lifetime of deposition target. Accordingly, the shadowing effect does not result in an additional venting and opening of a chamber of a processing system.

FIG. 2A illustrates yet further embodiments of a holding device 200. A mask 110 is attached to the carrier 220 such that the mask 110 can be released from the carrier 220, for example outside of a processing or deposition system. The cover 122 for covering the carrier 220 is inserted in a recess formed between the mask 110 and the carrier 220. That is, the mask and the carrier have, in combination, the recess for receiving the protrusion of the carrier cover 122. FIG. 2B shows the holding device 200 in a processing area, which has, for example, for rotatable sputter cathodes. When the carrier 220, the mask and the substrate are inserted in the processing region, the cover 122 that is provided with in the processing system can be positioned to cover the carrier. After the deposition process, material has been deposited on the substrate 10 as indicated by reference numeral 5. Thereafter, the cover 122 can be removed from the holding device, and the carrier 220 can be moved out of processing systems in company with the mask 110 and the substrate 10. Since the mask 110 can be easily removed by the releasable connection to the carrier, a clean mask can be provided for each deposition process or at least for each fifth or each tenth deposition process. As shown in FIGS. 2C and 2D, when another carrier and mask, or a cleaned carrier and mask, is inserted in the processing region, there is an increase built up of material on the carrier cover 122. However, the material buildup on the mask 110 is limited. Accordingly, the shadowing effect of the material layer 5 deposited on the mask 110 can be reduced and controlled.

As shown in FIGS. 2A to 2D, integration of the mask into the carrier allows for replacing this wear part frequently outside of the deposition system. For example, a carrier replacement can be conducted in order to minimize the impact on the machine tact. The carrier frame itself is protected by the carrier cover. Thereby, the necessity of cleaning the carrier can be reduced. In light of the above, the need to open e.g. a high vacuum coating machine is reduced. Thus, the uptime can be increased and the cost of operation can be reduced. Accordingly, embodiments described herein allow for continuous operation of a processing system, for example a coating machine. The necessity to open the chamber frequently to replace shieldings or masking apertures is reduced. Thereby, particularly instabilities in the process because of venting of the processing system or chambers thereof can be reduced and/or the uptime of the system can be increased because the system stays on the vacuum for a longer period of time. According to embodiments described herein, the processing system can be a system for static deposition wherein a carrier is used. Typically, embodiments relate to applications with high requirements with respect to undesired particular generation in the processing area. According to typical applications, embodiments can be directed to methods and systems for displays manufacturing. Since maintaining and opening of the chambers is reduced for embodiments described herein, an increase of undesired particles on the coated surface can be avoided. Yet further, a frequent replacement of the carrier and/or the mask outside of the processing system can result in more efficient production procedures as compared to opening of chambers and disassembling and reassembling a plurality of portions of the system.

However, the embodiments described herein are not limited to static deposition processes but can also be applied to dynamic deposition processes or in-line deposition processes. Thereby, a mask portion of the holding device is replaced more frequently. Accordingly, cleaning of the carrier can be conducted less frequently, which is in particular beneficial for large area substrates, such as large glass substrates during display manufacturing, solar thin-film manufacturing, or the like, where the carriers need to be disassembled for cleaning.

An example of the processed substrate 10 is shown in FIG. 5. As can be seen from FIG. 5, the layer 5 is deposited on the substrate 10. In light of masking of the substrate, i.e. providing a shield for example around the circumference of the substrate, a margin 55 can be provided at the circumference of the substrate. Such a masking can be required for certain applications.

Figure 3:
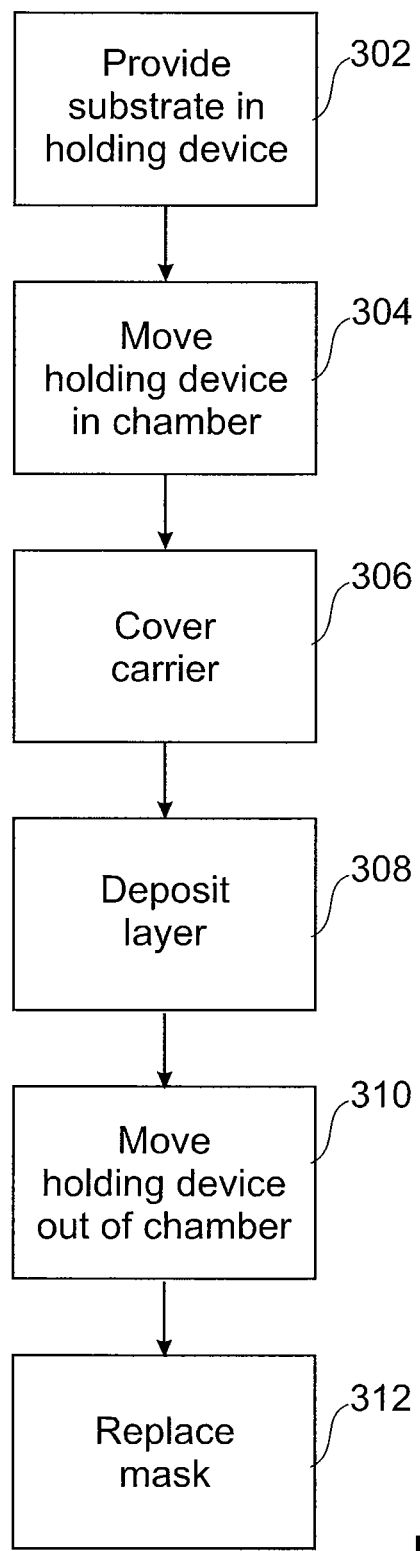
FIG. 3 is a flowchart illustrating a method for processing a substrate using a holding device according to embodiments described herein.

Embodiments relating to methods for processing the substrate are now described with respect to FIG. 3. In step 302, the substrate is provided in a holding device, wherein the holding device includes a carrier and a mask which is releasable attached to the carrier. This is for example shown in FIG. 4 where the substrate 10 is provided in the holding device having the carrier 120 and the mask 110. Thereby, the mask 110 shields a portion of the substrate 10. Within FIG. 4, the substrate in the holding device is provided on a transport system. For example, a support system can have rollers 424 supporting the carrier 120 in a vertical position. As exemplarily shown in the third and forth chamber 410 of the processing system 400 (see FIG. 4), rollers 422 can support the substrate from the back side.

The substrate is moved into a first chamber 410 of the processing system 400 in step 304. Typically, the substrate is moved in the first chamber such as a load lock through a valve assembly 412. Thereby, the holding device with the substrate supported therein can be moved in the first chamber, the first valve assembly 412 can be closed and the first chamber can be evacuated. Thereafter, the second valve assembly 412 can be opened and the holding device having the substrate mounted thereon is moved to a further chamber.

In step 306 the carrier is covered with the carrier cover 122 as shown in the second chamber 410 in FIG. 4. In step 308 a layer of material can be deposited on the substrate while the holding device with the substrate moves continuously through the further chambers 410 of the processing system 400. According to alternative implementations, the substrate can be moved from one chamber to the next chamber for a respective static deposition therein. Before the holding device and the substrate are moved out of the processing system 400 or out of a respective chamber of the system, the carrier cover is removed from the holding device and is maintained within the processing system or the respective processing chamber. In step 310 the holding device with the substrate therein is moved out of the chamber of the processing system typically through one or more further valve assemblies 412, which enable maintaining of a vacuum in the processing system. Thereafter, the mask which is releasably connected to the carrier can be replaced as indicated by step 312 of FIG. 3. In FIG. 4, it is illustrated that the substrate 10 is moved out of the holding device having a carrier 120 and mask 110. Thereafter, the mask 110 can be separated from the carrier 124. Typically, the mask can be replaced or cleaned and/or the carrier can be replaced or cleaned. According to alternative modifications, the carrier and the mask can be cleaned. Yet, a mask, which provides an inner shield for shielding the substrate during deposition or processing in general, can be provided in the processing system such that there is a limited, i.e. controlled, amount of material build up. Thereby, shadowing effects can be reduced or delimited, whereas at the same time the necessity for venting and opening one or more of the chambers or a processing system can be reduced.

In light of the above, a plurality of embodiments has been described. According to one embodiment, a holding device adapted for holding a mask and a substrate during processing of the substrate is provided. The holding device includes a substrate carrier adapted for carrying the substrate, a mask for masking the substrate, wherein the mask is releasably connected to the substrate carrier, wherein the substrate carrier, the mask, or the substrate carrier in combination with the mask has at least one recess adapted for receiving a cover for covering the substrate carrier during deposition. According to additional or alternative modifications thereof, the recess can be adapted for receiving a portion of the carrier cover; the recess can have a cross-sectional shape which is selected from the group consisting of a rectangular shape, a square shape, a concave shape, a triangular shape, and any combination thereof; the device can further include at least two substrate fixation elements, which are movably connected to the substrate carrier or the mask, particularly which are rotatably connected to the substrate carrier or the mask; the mask frame can be formed of a material selected from the group consisting: a thermal expansion stable material, the same material as the carrier, and Invar; the substrate carrier can be formed from a material selected from the group consisting of aluminum, stainless steel, AlMgSi1, AlMg4.5Mn, titanium and any combination there are thereof; and/or the mask can cover the circumference of the substrate, particularly covers the outer 2 mm to 8 mm along the circumference of the substrate. According to another embodiment, a substrate processing system is provided. The system includes a processing chamber, a carrier cover provided in the processing chamber, and a holding device according to any of the embodiments described herein. According to additional or alternative modifications thereof, the carrier cover, the mask and the substrate can form a surface, which has, in a cleaned condition, a topography with a height variation of 3 mm or less; an/or the portion of the carrier cover can be a protrusion having cross-sectional shape which is selected from the group consisting of a rectangular shape, a square shape, a convex shape, a triangular shape, and any combination thereof. According to a yet further embodiment, a method for processing a substrate is provided. The method includes providing a holding device having a substrate carrier and a mask, attaching the substrate to be processed to the holding device, transferring the carrier together with the substrate and the mask into a processing chamber, covering the carrier within the processing chamber, processing the substrate and transferring the carrier, the substrate and the mask out of the processing chamber. According to additional or alternative modifications thereof, a surface of the substrate, the carrier cover and the mask can face a deposition source during substrate processing; the method can further include removing the mask from the carrier after the transferring of the carrier out of the processing chamber, in particular, replacing the mask with a cleaned mask after the transferring of the carrier out of the processing chamber; and/or the method can further include removing a carrier cover for the covering of the carrier from the transfer chamber after a layer of at least 15 mm thickness, typically at least 20 mm thickness, has been deposited on the carrier cover.

While the foregoing is directed to embodiments of the invention, other and further embodiments of the invention may be devised without departing from the basic scope thereof, and the scope thereof is determined by the claims that follow.

What is claimed is:

1. A substrate processing system, comprising:
    a processing chamber;
    a carrier cover provided in the processing chamber; and
    a holding device adapted for holding a mask and a substrate during processing of the substrate, the holding device comprising:
        a substrate carrier adapted for carrying the substrate; and
        a mask for masking the substrate, wherein the mask is releasably connected to the substrate carrier;
        wherein the substrate carrier, the mask, or the substrate carrier in combination with the mask has at least one recess arranged such that a protrusion of the cover for covering the substrate carrier during deposition can be inserted in the recess when the mask is connected to the substrate carrier, and wherein the substrate processing system is configured for removing, within the processing chamber, the carrier cover from the holding device holding the mask and the substrate, and configured for moving the holding device holding the mask and the substrate out of the processing chamber while maintaining the carrier cover within the processing chamber.

2. The substrate processing system according to claim 1, wherein the carrier cover, the mask and the substrate form a surface, which has a topography with a height variation of 3 mm or less.

3. The substrate processing system according to claim 1, wherein the protrusion having a cross-sectional shape which is selected from the group consisting of a rectangular shape, a square shape, a convex shape, a triangular shape, and any combination thereof.

4. The substrate processing system according to claim 1, the holding device further comprising:
    at least two substrate fixation elements, which are movably connected to the substrate carrier or the mask.

5. The substrate processing system according to claim 1, the holding device further comprising:
    at least two substrate fixation elements, which are rotatably connected to the substrate carrier or the mask.

6. The substrate processing system according to claim 1, wherein a mask frame is formed of a material selected from the group consisting: the same material as the substrate carrier and Invar.

7. The substrate processing system according to claim 1, wherein the substrate carrier is formed from a material selected from the group consisting of aluminum, stainless steel, AlMgSi1, AlMg4.5Mn, titanium and any combination there are thereof.

8. The substrate processing system according to claim 1, wherein the mask covers the circumference of the substrate.

9. The substrate processing system according to claim 1, wherein the protrusion of the cover is fixedly connected to the cover.

10. The substrate processing system according to claim 1, wherein the recess is arranged for slidably receiving the protrusion of the cover.

11. The substrate processing system according to claim 1, wherein the holding device further comprises a clamping mechanism for clamping the substrate, wherein the clamping mechanism is an interlock which can be rotated with respect to an axis.

* * * * *

UNITED STATES PATENT AND TRADEMARK OFFICE
CERTIFICATE OF CORRECTION

PATENT NO. : 8,431,493 B2
APPLICATION NO. : 12/890194
DATED : April 30, 2013
INVENTOR(S) : Lindenberg Page 1 of 1

It is certified that error appears in the above-identified patent and that said Letters Patent is hereby corrected as shown below:

In the Claims:

Column 8, Claim 7, Line 30, please delete "AlMgSil, AlMg4.5Mn,".

Signed and Sealed this
Twenty-fifth Day of June, 2013

Teresa Stanek Rea
*Acting Director of the United States Patent and Trademark Office*